United States Patent
Damodaran et al.

(10) Patent No.: US 7,158,902 B2
(45) Date of Patent: Jan. 2, 2007

(54) PROCESS PARAMETER BASED I/O TIMING PROGRAMMABILITY USING ELECTRICAL FUSE ELEMENTS

(75) Inventors: Raguram Damodaran, Plano, TX (US); Manjeri Krishnan, Richardson, TX (US); Todd Beck, Lewisville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 436 days.

(21) Appl. No.: 10/679,724

(22) Filed: Oct. 6, 2003

(65) Prior Publication Data

US 2005/0075830 A1    Apr. 7, 2005

(51) Int. Cl.
  *G06F 19/00*  (2006.01)
(52) U.S. Cl. .......................................... 702/79; 714/25
(58) Field of Classification Search ................. 702/79, 702/76, 182–185, 188, 77, 78; 714/25, 48
See application file for complete search history.

(56) References Cited

U.S. PATENT DOCUMENTS

2002/0004926 A1*   1/2002   Erickson ..................... 714/814

* cited by examiner

*Primary Examiner*—Edward Raymond
(74) *Attorney, Agent, or Firm*—Robert D. Marshall, Jr.; W. James Brady; Frederick J. Telecky, Jr.

(57) ABSTRACT

Electrical fuses (eFuses) are applied to the task of achieving very tightly controlled Input-Output (I/O) timing specifications. The I/O timing is made programmable and subject to adjustment as part of wafer probe testing. The techniques of parametric adjustment presented are based upon what is commonly referred to as clock skewing or clock tuning. The invention describes methods to select the clock skewing on a die-to-die basis based on functional testing with the actual parametric limits imposed on parameters of interest. The results associated with each die form the basis for hard-programming the selected clock skew value into the die via electrical fuses.

11 Claims, 7 Drawing Sheets

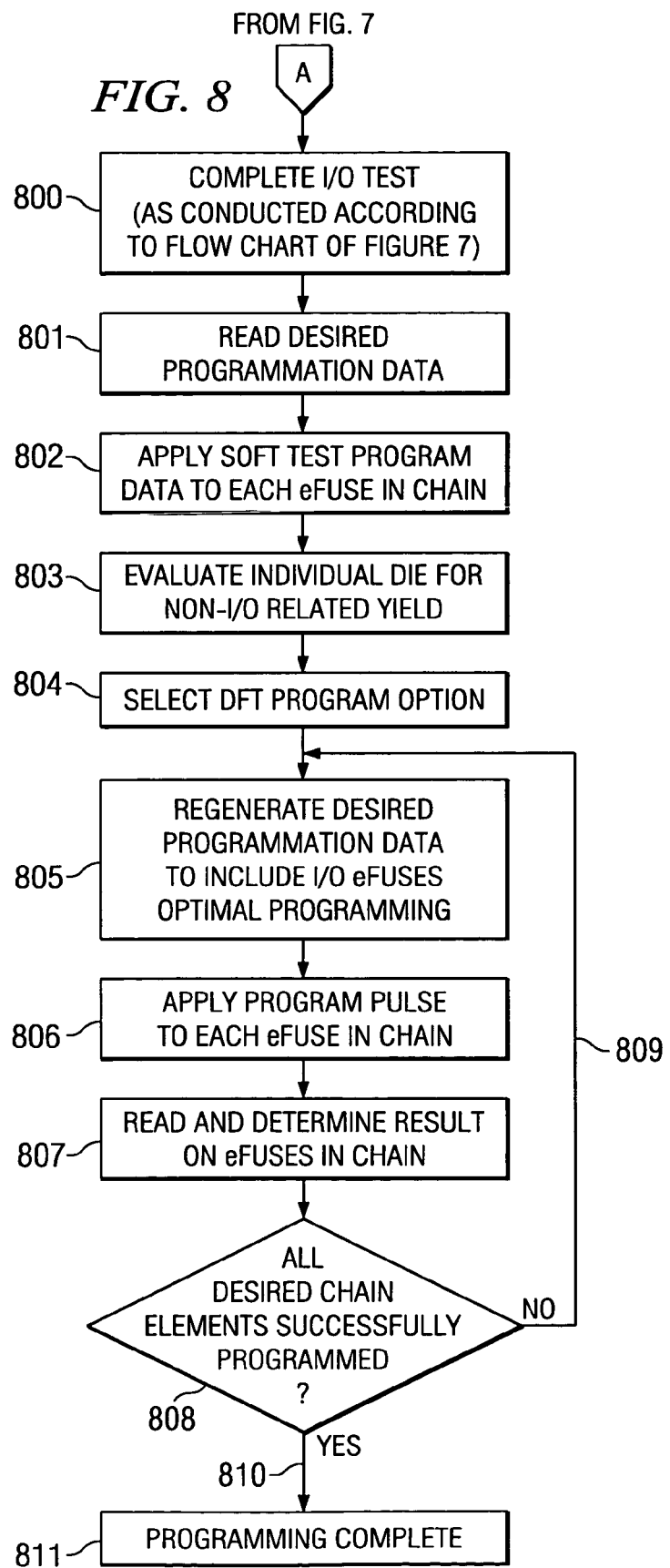

PROCESS PARAMETER BASED I/O TIMING PROGRAMMABILITY USING ELECTRICAL FUSE ELEMENTS

TECHNICAL FIELD OF THE INVENTION

The technical field of this invention is timing control for integrated circuit input and outputs.

BACKGROUND OF THE INVENTION

Microprocessor devices fabricated with current CMOS technology are designed with great care to comprehend the circuit performance variations due to process shifts from one tolerance extreme to the other. Designers have become accustomed to speak of MOS transistors having maximum drive capability as strong transistors and MOS transistors with minimum drive capability as weak transistors. At both of these extremes, the transistors are within specified process tolerance limits, and it is desirable to maximize the useable yield of all functional devices even though different speed performance devices will be produced. Normally the salability of the whole performance distribution is not difficult to establish.

In practice, designs are analyzed by (a) transistor strength, (b) power supply voltage tolerances, (c) interconnect resistance and capacitance and (d) operating temperature, among other possible parameters. Logic circuits must match as closely as possible the memory and the interfacing should be optimized on every die in as much as practical.

Experience indicates that I/O designs should be subjected to rather stringent minimum-maximum propagation delay limits to assure proper interface functioning between the outputs of a transmitting chip and the inputs of a receiving chip. Latching elements are present at both the signal source and signal destination and set-up time and hold-time requirements must be met to assure desired performance. Therefore, on a given integrated circuit the specifications for maximum set-up time and maximum hold time at critical inputs that must be tightly controlled. Often the degree of control the design can provide is insufficient to allow the entire distribution of circuit performance to meet the critical design parameters. In these cases techniques to adjust the performance of critical input/output functions provides a means to improve yield.

Design/Fabrication/Test Methodology

Traditionally, critical I/O timing specifications make it necessary for designers to comprehend all of the following design characteristics: (a) I/O interface design/architecture; (b) simplified clock distribution; (c) master/slave protocols; (d) self-clocking techniques including the use of analog or digital phase locked loop functions to create alignments between I/O circuit and process; (e) I/O buffers designed for low voltage-temperature performance variation; (f) rigid process controls; (g) I/O test screening; and (h) speed sort parts by I/O speeds/application. All these design and application considerations involve sophisticated design/process practices and/or compromises in design/process.

Previous Techniques for Optimal I/O Interface Performance

Originally, I/O performance matching was achieved by altering the number of gates in a delay path by adding or removing gates in a revision of the chip interconnect pattern. This approach incurs significant costs and cycle times to produce revised photomask reticles and to complete fabrication of the revised product.

A later technique of I/O performance adjustment employed laser fuses. Laser fuses built into the die may be blown to achieve many of the desired I/O timing adjustments. However, laser fuses must be large in chip area to ensure dependable and successful laser beam hit.

Electrical Fuses for Programming

Electrical fuses (eFuses) are extremely attractive for this kind of application. Such eFuses have made a great impact on digital processor devices. Originally eFuses were applied to the obvious needs for device programmability. The possibility of programming a device to do a specific task efficiently has made modest cost special purpose processors a reality. Many fusible interconnect links are constructed of materials such as deposited amorphous polysilicon.

In the prior art electrical fuses (eFuses) in VLSI silicon devices are programmed by applying a relatively large amount of power to the fuse body to melt and separate the fuse body. This changes the eFuse resistance from a low pre-blow resistance to a high post-blow resistance. This result can be sensed to determine the state of the eFuse: unblown or blown.

eFuse Implementation

The eFuse for a conventional programmable device application is normally configured as a chain or two-dimensional array containing sometimes hundreds of eFuses and supporting logic. Several definitions will be helpful in clarifying the descriptions of eFuse implementation to follow.

An eFuse is a circuit element, which has a natural un-programmed state, but may be permanently programmed to the opposite state. An eFuse element includes an eFuse along with its programming and sensing circuits. An eFuse cell includes an eFuse element plus the local logic required to integrate it into an eFuse chain. An eFuse chain is one or more eFuse cells connected in series or arrays. An eFuse controller is comprised of the control logic designed to access the eFuse chains or arrays. An un-programmed eFuse has a pre-defined maximum low resistance value. A programmed eFuse has a pre-defined minimum high resistance value. An eFuse chain is programmed by loading the desired fused state and non-fused state locations into a programming database containing a record for the individual elements of the entire chain. Then those values are sequentially programmed into each eFuse.

FIG. 1 illustrates the conventional eFuse cell circuit configuration. This includes eFuse element 101 plus the local logic required to integrate it into an eFuse chain. This logic includes a CData flip-flop 103 that is clocked by the Enable Clock 108 and stores cell data in the chain. The logic further includes a PData flip-flop 102 that is clocked by the Data Clock 106 and latches program data being passed into the eFuse cell.

In the program mode, incoming PData In 107 is latched into the PData flip-flop 102 and programmed into the eFuse element on the occurrence of one or more program pulses initiated at Program input 110. PData Out passes to the next eFuse cell via path 116. In the program mode PData Out is passed through multiplexers 104 and 105 and is latched into the CData flip-flop 103. The voltage VPP 109 is the programming power source. Program data is passed serially to the next cell in the chain at PData Out line 116.

In the test mode, the CData flip-flop 103 latches the data from the present cell and passes it to Cell Data Out 115. This data from the present cell is passed through multiplexer 104 and multiplexer 105 as directed by the Test input 111.

Initz input 112 acts to initialize all flip-flops in the cell chain prior to the programming cycle. Margin input 114 allows adjustment to the reference input for a differential amplifier so that the desired high resistance values specified for a program element may be modified.

FIG. 2 illustrates a simplified view of a conventional eFuse system having an eFuse controller 200 and a number of series-connected eFuse cells 201 through 205. Each eFuse cell 201 through 205 has the local logic of FIG. 1 for integrating the cells into an eFuse array. Cell 201 differs however in that it provides storage for a burned-in die identifier (die I.D.). At the last stage of the array 205 PData Out 208 and CData Out 209 are passed back to the controller as required in the program and test modes. The nodes labeled Cell Out (e.g. 206 and 207) provide a single bit digital output representing the state of that cell, both in the programmed state and in the soft test state. The soft test state provides a non-permanent condition that emulates the state that would have been established after the fuse is programmed.

I/O Design Parameters and Specifications

The critical I/O timing specifications consist of the following timing parameters: $t_{pdmin}$ the minimum propagation delay for signal data output; $t_{pdmax}$ the maximum propagation delay for signal data output; $t_{isetupmin}$ the minimum setup time for data input signal; and $t_{iholdmin}$ the minimum hold time for data input signal. These timing specifications must be met in each of the nine design analysis corners listed in Table 1.

TABLE 1

Design Analysis Corners

| Corner | Core Voltage | I/O Voltage | Temp Celsius | Metal R/C |
|---|---|---|---|---|
| 1 | 1.20 | 3.30 | 25 | typical |
| 2 | 1.20 | 3.30 | 25 | typical |
| 3 | 1.08 | 3.00 | 105 | maximum |
| 4 | 1.26 | 3.00 | 105 | maximum |
| 5 | 1.32 | 3.60 | −40 | minimum |
| 6 | 1.47 | 3.60 | −40 | minimum |
| 7 | 1.98 | 5.00 | 25 | minimum |
| 8 | 0.68 | 1.10 | 25 | minimum |
| 9 | 1.70 | 4.60 | 140 | minimum |

Typically there is also a requirement for adequate guard band tolerances to account for correlation between test machines and for stability of values measured in repetitive tests.

SUMMARY OF THE INVENTION

Electrical fuses (eFuses) are employed to program I/O timing without requiring additional processing steps and expensive equipment. This reduces the cycle time and cost of fuse blowing. Programmation of electrical fuses is done electrically on the test machine at wafer probe. Electrical fuses provide a soft test feature wherein the effect of I/O timing can be tested without actually programming the fuses. Electrical fuses thus provide a very efficient non-volatile method to achieve balanced I/O timing, drastically cutting down costs and cycle times involved. The techniques of parametric adjustment presented are based upon what is commonly referred to as clock skewing or clock tuning. The invention describes methods to select the clock skewing on a die-to-die basis based on functional testing with the actual parametric limits imposed on parameters of interest. The results associated with each die form the basis for hard-programming the selected clock skew value into the die via electrical fuses.

BRIEF DESCRIPTION OF THE DRAWINGS

These and other aspects of this invention are illustrated in the drawings, in which:

FIG. 8 illustrates the prescribed procedure of this invention for completing the non-I/O testing of an individual die to determine optimal eFuse programming states for the remainder of programmable circuitry.

DETAILED DESCRIPTION OF PREFERRED EMBODIMENTS

The invention describes methods for programmable selection of internal clock timing on a die-to-die basis based on the measurement of set-up time, hold time, and propagation delay parameters associated with the die, and hard-programming the selected clock skew into the die via electrical fuses.

These clock-tuning techniques do not require design/process sophistication or compromise. These techniques, commonly referred to as clock-skewing, involve incremental clock delays to be introduced at specific points in the clock distribution path. The invention describes methods to select the clock skewing on a die-to-die basis based on the measured timing parameters associated with the die and hard-programming the selected clock skew into the die via electrical fuses.

This clock tuning methodology allows a larger distribution of high performance devices fabricated from die having incrementally different transistor strengths to meet very tight I/O timing specifications. These timing specifications are required to be met in each of the nine design analysis corners of Table 1 above.

Figure 3:
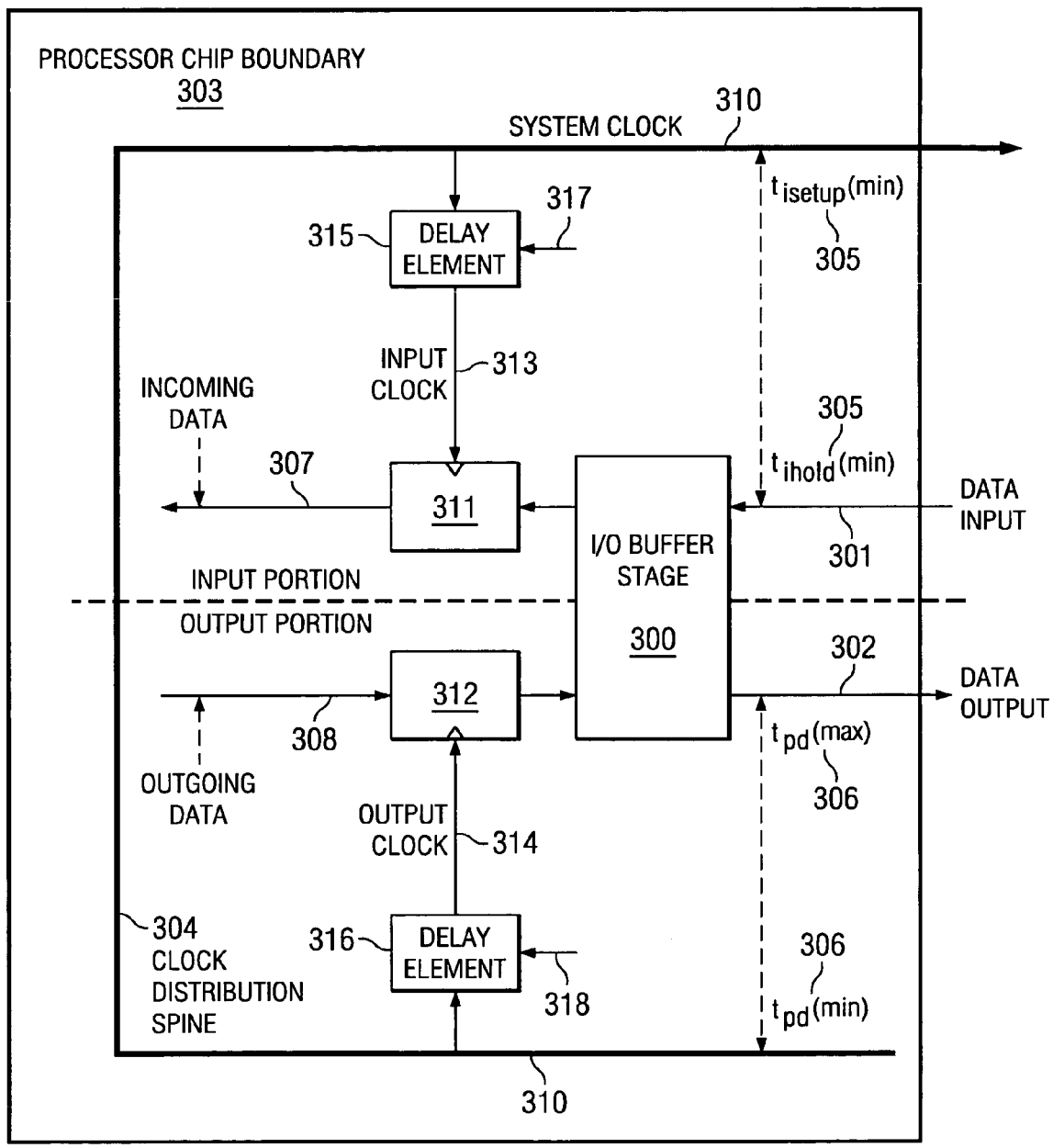
FIG. 3 illustrates the I/O buffer block for a processor device and the associated input and output register stages and pertinent signal and specification definitions.

FIG. 3 illustrates a high-speed I/O buffer block 300 for a processor device with boundary 303 showing the associated input and output register stages and pertinent signal and specification definitions. System clock 310 passes to input and output portions of the circuit by clock distribution spine 304. Most significant among high-speed buffer I/O blocks are the external memory interface (EMIF) function, but the clock tuning adjustments described here are by no means limited to EMIF. The I/O buffer stage 300 has an input portion buffering data input 301 and output portion buffering data output 302. Data input 301 passes to register 311 and is clocked by input clock 313. Input clock 313 is a delayed form of system clock 310. Registered data input is denoted by the label incoming data 307. Delay element 315 is controlled by eFuse program inputs 317. Outgoing data 308 is passed to register 312, which is clocked by output clock 314. Output clock 314 is a delayed form of system clock 310. Delay element 316 is controlled by eFuse program inputs 318. Data from register 312 is buffered and passed to data output node 302.

The crucial specifications on high-speed I/O blocks are: $t_{pdmin}$ the minimum propagation delay for signal data output; $t_{pdmax}$ the maximum propagation delay for signal data output; $t_{isetupmin}$ the minimum setup time for data input signal; and $t_{iholdmin}$ the minimum hold time for data input signal.

While the set-up times are measured from data input 301 to system clock 310, this actual measured set-up time may be adjusted by adding increments of delay from system clock 310 to input clock 313 via delay element 315. Stated another way, while the set-up time between data input 301 and internal input clock 313 remains constant whatever delay is introduced by delay element 315, the set-up time between the data input 301 and the actual external clock node 310 decreases as additional delay is added in block 315. This is because if the input clock at node 313 arrives at a later time, the data input 301 may also arrive at a later time (less set-up time as measured externally).

Similarly while hold time is measured from data input 301 to system clock 310, this actual measured hold time may be adjusted by adding increments of delay from system clock 310 to input clock 313 via delay element 315. Stated another way, while the hold time between data input 301 and internal input clock 313 remains constant whatever delay is introduced by delay element 315, the hold time between the data input 301 and the actual external clock node 310 increases as additional delay is added in block 315. This is because if the input clock at node 313 arrives at a later time, the data input 301 must remain valid for a longer time (more hold time as measured externally).

Figure 4:
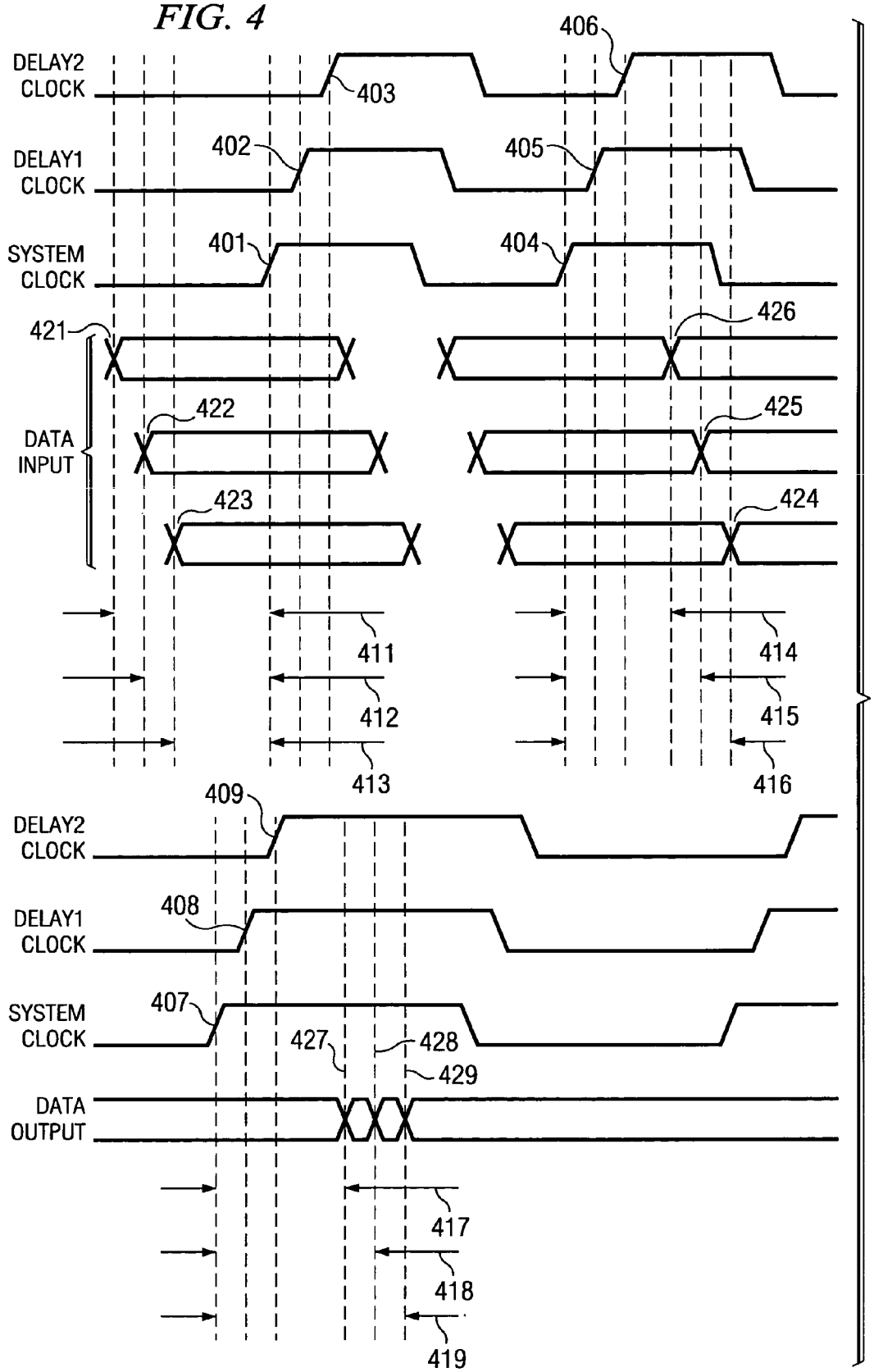
FIG. 4 illustrates the timing diagrams for set-up time, hold time, and propagation delay for the I/O trimming operations of this invention.

FIG. 4 illustrates these adjustments in timing diagrams. System clock 401 would have a set-up time of 411 with respect to data input edge 421 if the delay of delay element 315 were set to zero. Substituting input delay1 clock 402 as delayed by delay element 315 for the input clock, the set-up time becomes 412 (system clock 401 with respect to data input edge 422). Substituting input delay2 clock 403 as further delayed by delay element 315 for the input clock, the set-up time becomes 413 (system clock 401 with respect to data input edge 423). Thus adding delay in delay element 315 directly subtracts from set-up time as measured with respect to system clock edge 401.

System clock 404 has a hold time of 414 with respect to data input edge 424 if the delay of delay element 315 is zero. When input clock is delayed by delay element 315 to become delay1 clock 405, the hold time becomes 415 (system clock 401 with respect to data input edge 425). Further if input clock is further delayed by delay element 315 to become delay2 clock 406, the hold time becomes 416 (system clock 401 with respect to data input edge 426). Thus adding delay in delay element 315 directly adds to hold time as measured with respect to system clock edge 404. This opposite direction of set-up time and hold time adjustments by an input clock delay adjustment is exactly as desired to center the set-up time and hold time within maximum specification limits as the two parameters also vary in the opposite manner with process tolerance shifts.

In FIG. 3, propagation delay times are measured from system clock 310 to data output 302, but this actual measured propagation delay time may be adjusted by adding increments of delay from system clock 310 to output clock 314 via delay element 316. Added delay introduced in delay element block 316 adds directly to the propagation delay time between system clock 310 and data output node 302.

This is also illustrated in the timing diagrams of FIG. 4. System clock 407 has a propagation delay time of 417 with respect to data output edge 427 if the delay of delay element 316 is zero. When the output clock is delayed by delay element 316 to become delay1 clock 408, the propagation delay time becomes 418 (system clock 407 with respect to data output edge 428). When output clock is further delayed by delay element 316 to become delay2 output clock 409, the propagation delay time becomes 419 (system clock 407 with respect to data output edge 429). Thus adding delay in delay element 316 directly adds to propagation delay time.

Figure 5:
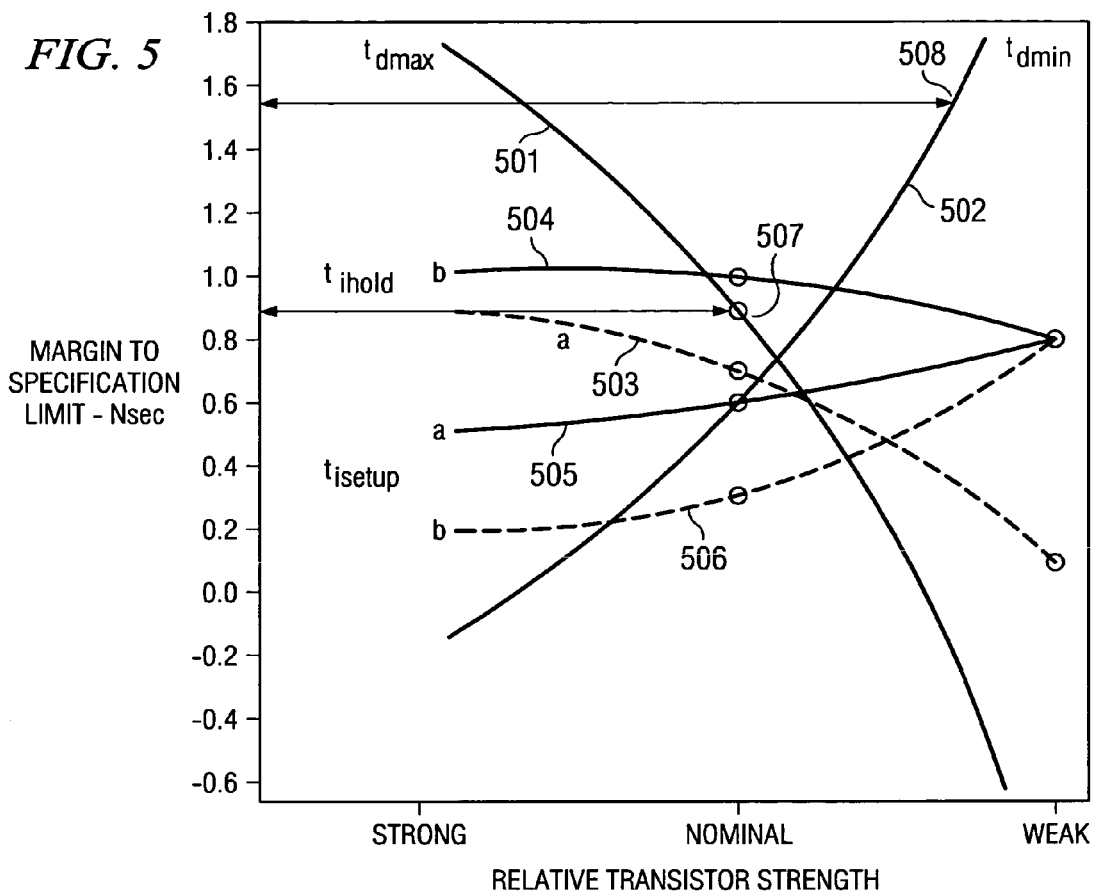
FIG. 5 illustrates the variation of set-up time, hold time and propagation delay for a high speed I/O function and the manner in which margin to specification varies with transistor strength.

FIG. 5 illustrates the variation of the margin against specification limit for each of the critical design parameters (vertical axis) versus relative change in the strength of the transistors as fabricated (horizontal axis). Propagation delay time variations with transistor strength affecting $t_{dmax}$ and $t_{dmin}$ are given in curves 501 and 502 respectively. Two separate designs a and b for hold time parameter performance are illustrated in respective curves 503 and 504. The corresponding two separate designs a and b for set-up time parameter performance are illustrated in respective curves 505 and 506. These could represent slightly different requirements on two types of input circuits.

In reading the curves consider two examples. For nominal transistor strength, point 507 at the intersection of curve 501 ($t_{dmax}$) and nominal transistor strength indicates a margin in the $t_{dmax}$ specification of +0.9 Nsec. For weak transistor strength, point 508 at the intersection of curve 502 ($t_{dmin}$) and weak transistor strength indicates a margin in the $t_{dmin}$ specification of +1.55 Nsec.

Figure 6:
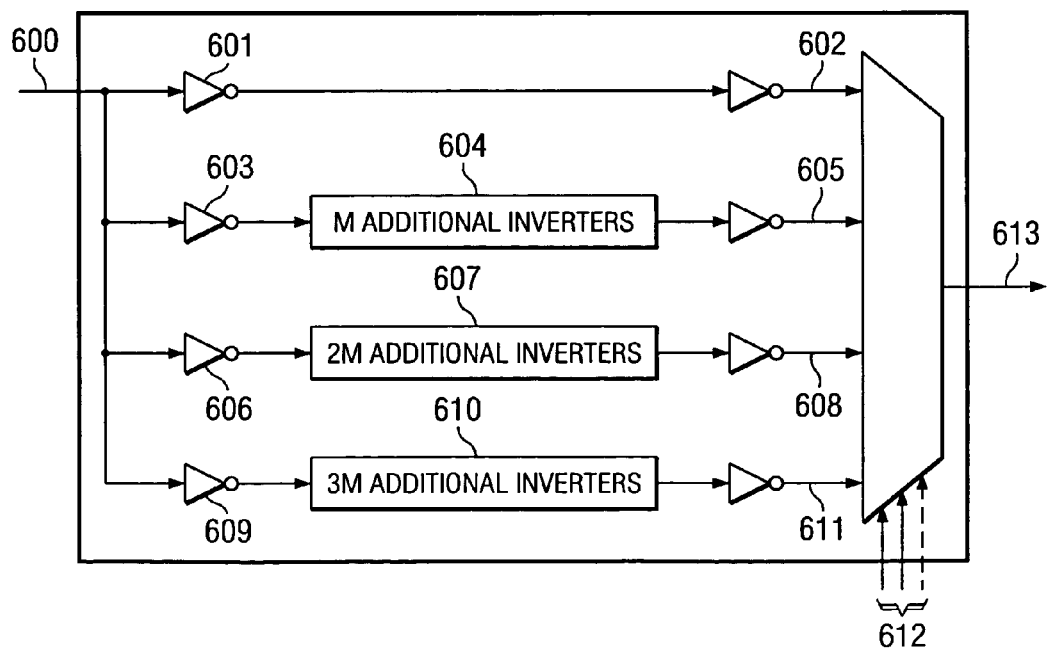
FIG. 6 illustrates the concept of using multiplexer-selected programmable clock paths for skewing timing of input clocks and output clocks for adjustment of set-up time, hold time and propagation delay.

FIG. 6 illustrates the construction of a delay element for each of the functional blocks 315 and 316 of FIG. 3. System clock input is shown as 600. Four clock paths include two inverters and one or more possible increments of 1 M inverters of additional delay (respectively denoted by 604, 607, and 610) with propagation delay varying from smallest delay (601, 602) to largest delay (609, 610, 611) for example. Increments of delay are determined by the delay of M-inverters (e.g. M=6) being added to cumulatively to the longer paths. eFuse elements provide inputs 612 in a code for multiplexer select of programmed clock delays to select the input clock 613 (313 of FIG. 3) or the output clock 613 (314 of FIG. 3). FIG. 6 shows four paths selected primarily by two select inputs 612. This is clearly extendable to more paths, for example, up to eight paths using three select lines with one or more unallowed states in the select code.

Figure 7:
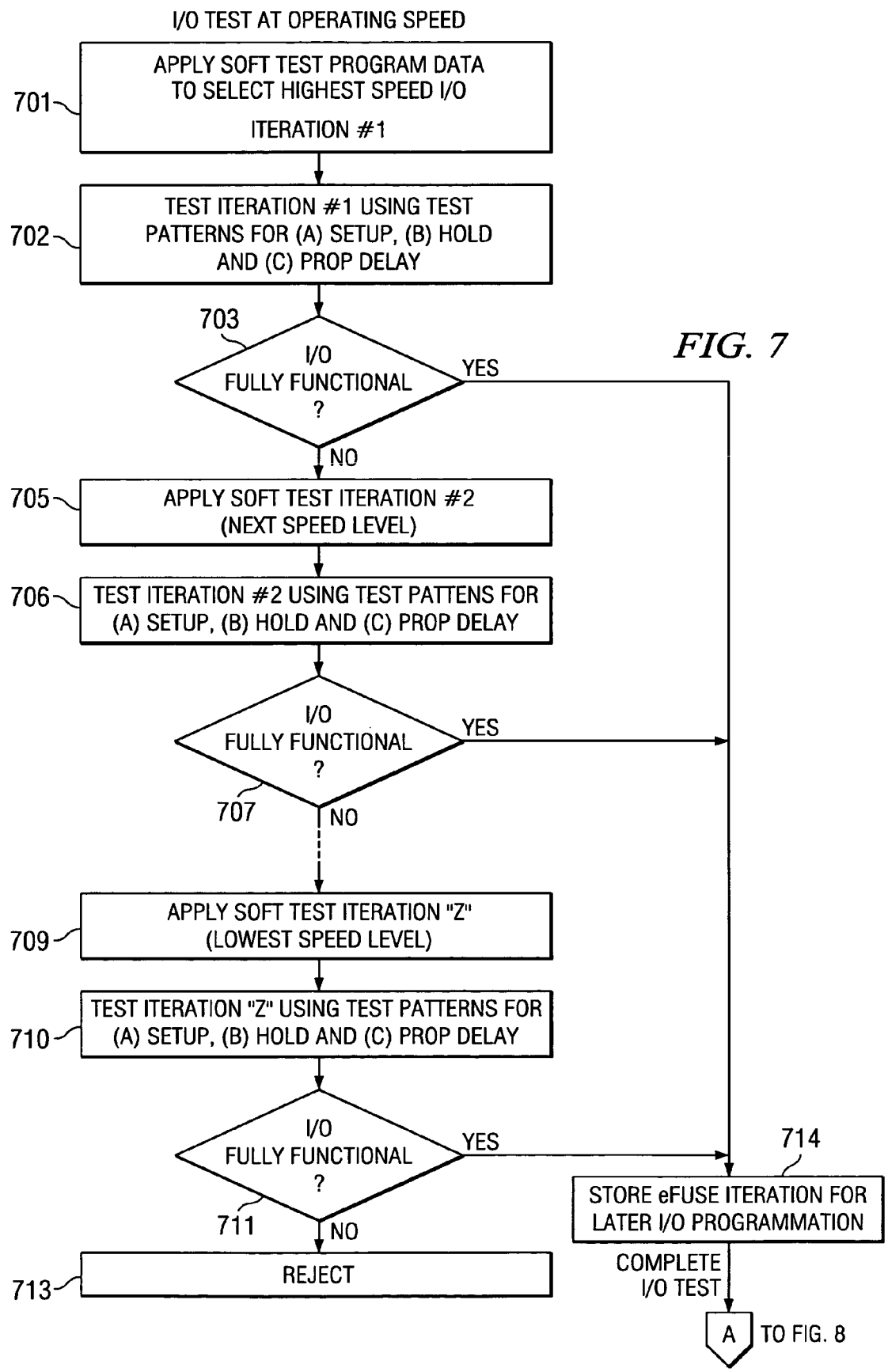
FIG. 7 illustrates the prescribed procedure of this invention for completing the I/O testing of an individual die to determine optimal eFuse programming states for I/O circuitry.

FIG. 7 illustrates the procedure of this invention for memory testing of an individual die to determine optimal programming of the eFuse driven I/O programming signals. Block 701 determines the highest speed I/O input clock and the highest output clock. This iteration is programmed via soft fuses. Block 702 performs full I/O test for this test iteration #1. Query 703 decides whether the I/O is fully functional. If the I/O is fully functional (Yes at query 703), then this programming iteration is stored in block 714. If the I/O is not fully functional (No at query 703), then to block 705 applies a soft test to iteration #2, the next slower speed level.

Block 706 performs another full I/O test for this test iteration #2. Query 707 decides whether the I/O is fully functional for iteration #2. If the I/O is fully functional (Yes at query 707), then block 714 stores this programming choice. If the I/O is not fully functional (No at query 707), then flow passes to a next iteration at the next slower speed level. This process repeats until either the I/O is fully functional or it reaches the final iteration #Z for the slowest speed level in block 709. Block 710 performs a final full I/O test. Final query 711 determines whether the I/O is fully functional. If the I/O is fully functional (Yes at query 711), then block 714 stores this programming choice. If the I/O is not fully functional (No at query 711), then the integrated circuit is rejected. From block 714, die testing proceeds to the flow of FIG. 8.

Figure 1:
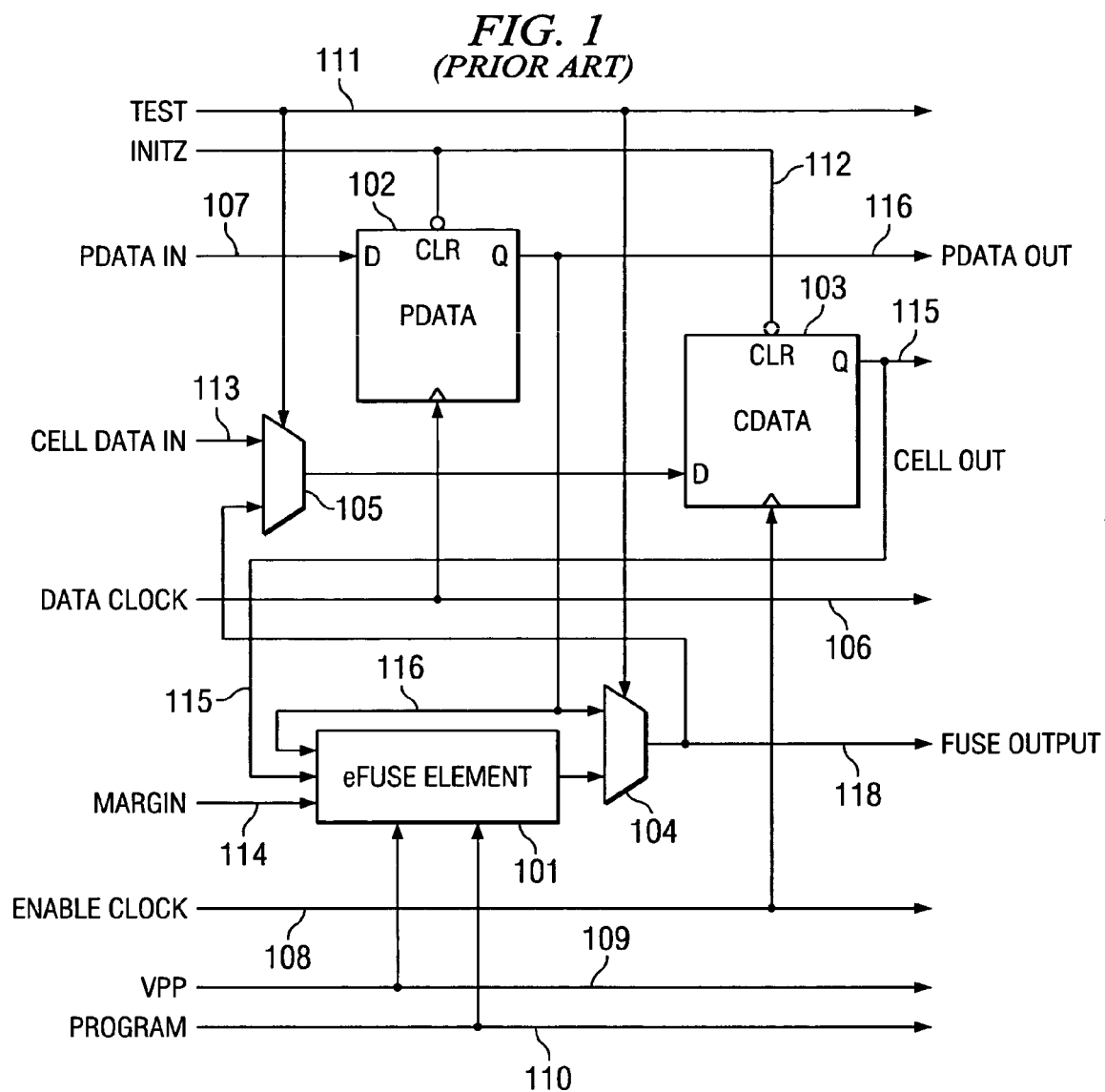
FIG. 1 illustrates the conventional eFuse cell circuit configuration, which is comprised of an eFuse element plus the local logic required to integrate it into an eFuse chain (Prior Art)
Figure 2:
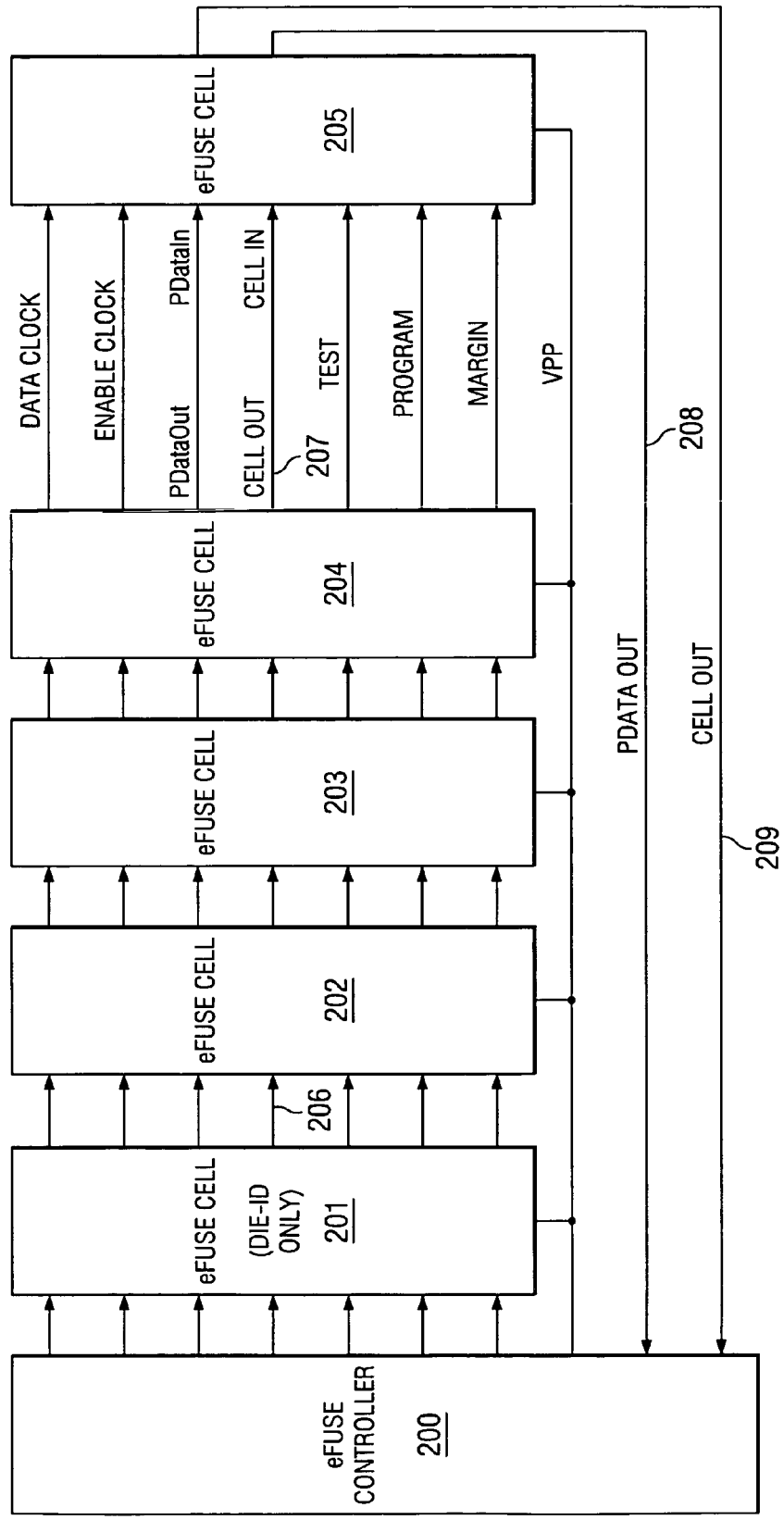
FIG. 2 illustrates a simple conventional eFuse system having an eFuse controller and a number of series-connected eFuse cells integrated into an eFuse array (Prior Art)

FIG. 8 illustrates the procedure for wafer testing and programming the full complement of eFuses on a given die. Block 800 represents the I/O testing illustrated in the flow chart of FIG. 7. Block 801 reads the desired I/O and non-I/O desired programming data and passes this to the eFuse controller (see 200 of FIG. 2). Block 802 applies the programming data to the eFuse chains using the soft program feature. Block 803 evaluates the non-I/O eFuse programming for each die for overall yield. Block 804 selects the optimal programming options.

Block 805 begins the final programming operations. Block 806 subjects the eFuses of each chain to program pulses and to blow them according to the regenerated program data input. Block 807 reads out the program results and compares then to the desired data. Block 808 determines if the eFuse results are satisfactory. If all the eFuses are properly programmed (Yes at query 808), the flow proceeds via path 810 to programming complete block 811. If the eFuses are not all properly programmed (No at query block 808), then path 809 returns to block 805 to regenerate programming commands for eFuses, which were to be programmed but incorrectly remained unprogrammed.

What is claimed is:

1. A method for adjusting input clock timing affecting performance of data input operations of an integrated circuit comprising the steps of:
   successive testing data input operation with an incrementally delayed input clock until all input operations pass;
   determining target state programming bits to set an input clock delay equal to the delay of said delayed input clock passing input operations;
   writing the target state of programming bits into a write once memory; and
   controlling input clock delay corresponding to said programming bits stored in the write once memory.

2. The method of claim 1, further comprising:
   after determining the target state programming bits and before writing the target state programming bits into the write once memory
   storing the target state programming bits in a read/write memory,
   testing a non-memory portion of integrated circuit while controlling input delay clock corresponding to the target state programming bits stored in the read/write memory,
   determining if the non-memory portion fails the test, and
   incrementally delaying the input clock and repeating said steps of storing, testing and determining until the non-memory portion passes the test.

3. The method of claim 1 wherein:
   said step of writing the target state of programming bits into the write once memory includes
   applying a programming voltage to each programming bit whose target state is a first digital state,
   determining whether each programming bit whose target state is the first digital state reads as the first digital state, and
   applying the programming voltage to each programming bit whose target state is the first digital state but which reads a second, opposite digital state,
   repeating said steps of determining and applying the programming voltage to each programming bit whose target state is the first digital state but which reads the second digital state until all programming bits whose target state is the first digital state read as the first digital state.

4. The method of claim 1 wherein:
   said step of writing the target state of programming bits into a write once memory includes writing programming bits not related to data input operations performance.

5. The method of claim 4 wherein:
   the programming bits not related to data input operations performance include an identification code of a specific die.

6. The method of claim 1 further comprising the steps of:
   successive testing data output operation with an incrementally delayed output clock until all output operations pass;
   determining output target state programming bits to set an output clock delay equal to the delay of said delayed output clock passing input operations;
   writing the output target state of programming bits into the write once memory; and
   controlling output clock delay corresponding to said programming bits stored in the write once memory.

7. A method for adjusting output clock timing affecting performance of data output operations of an integrated circuit comprising the steps of:
   successive testing data output operation with an incrementally delayed output clock until all output operations pass;
   determining target state programming bits to set an output clock delay equal to the delay of said delayed output clock passing input operations;
   writing the target state of programming bits into a write once memory; and
   controlling output clock delay corresponding to said programming bits stored in the write once memory.

8. The method of claim 7, further comprising:
   after determining the target state programming bits and before writing the target state programming bits into the write once memory
   storing the target state programming bits in a read/write memory,
   testing a non-memory portion of integrated circuit while controlling output clock delay corresponding to the target state programming bits stored in the read/write memory,
   determining if the non-memory portion fails the test, and
   incrementally delaying the output clock and repeating said steps of storing, testing and determining until the non-memory portion passes the test.

9. The method of claim 7 wherein:
   said step of writing the target state of programming bits into the write once memory includes
   applying a programming voltage to each programming bit whose target state is a first digital state, determining whether each programming bit whose target state is the first digital state reads as the first digital state, and applying the programming voltage to each programming bit whose target state is the first digital state but which reads a second, opposite digital state, repeating said steps of determining and applying the programming voltage to each programming bit whose target state is the first digital state but which reads the second digital state until all programming bits whose target state is the first digital state read as the first digital state.

10. The method of claim 7 wherein:

said step of writing the target state of programming bits into a write once memory includes writing programming bits not related to data output operations performance.

11. The method of claim 10 wherein:

the programming bits not related to data input operations performance include an identification code of a specific die.

\* \* \* \* \*